(12) United States Patent
Pandey et al.

(10) Patent No.: US 9,430,595 B2
(45) Date of Patent: Aug. 30, 2016

(54) MANAGING MODEL CHECKS OF SEQUENTIAL DESIGNS

(71) Applicant: Synopsys Inc., Mountain View, CA (US)

(72) Inventors: Manish Pandey, Saratoga, CA (US); Jinqing Yu, Fremont, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/691,789

(22) Filed: Dec. 1, 2012

(65) Prior Publication Data

US 2014/0157216 A1    Jun. 5, 2014

(51) Int. Cl.
*G06F 9/455* (2006.01)
*G06F 17/50* (2006.01)

(52) U.S. Cl.
CPC .................................. *G06F 17/504* (2013.01)

(58) Field of Classification Search
USPC ......................................................... 716/106
See application file for complete search history.

(56) References Cited

U.S. PATENT DOCUMENTS

| 5,331,568 | A  | * | 7/1994  | Pixley ........................... 716/107 |
| 6,009,252 | A  | * | 12/1999 | Lipton .......................... 716/112 |
| 6,334,205 | B1 | * | 12/2001 | Iyer et al. ..................... 716/105 |
| 7,146,589 | B1 | * | 12/2006 | Rampon et al. ............... 716/107 |
| 2004/0243373 | A1 | * | 12/2004 | Sercu et al. ................... 703/14 |
| 2006/0111884 | A1 | * | 5/2006 | McGaughy et al. ............. 703/14 |
| 2008/0216032 | A1 | * | 9/2008 | McElvain et al. ................ 716/5 |

OTHER PUBLICATIONS

Mishchenko et al., "A Semi-Canonical Form for Sequential AIGs", 2012, 21st International Workshop on Logic and Synthesis.

* cited by examiner

*Primary Examiner* — Bryce Aisaka
(74) *Attorney, Agent, or Firm* — Paul S. Drake; Craig Shinners (57) ABSTRACT

A method, system or computer usable program product for model checking a first circuit model including determining whether the first circuit model is functionally equivalent to one of a set of prior circuit models stored in persistent memory, and in response to determining functional equivalence, utilizing a processor to provide test results for the functionally equivalent prior circuit model.

27 Claims, 7 Drawing Sheets

| SIGNATURE 805 | VPID 810 | VP 815 | RESULTS 820 | ADDITIONAL DATA 825 |
|---|---|---|---|---|
| SIGNATURE_1 | VPID_1 | VP_1 | RESULTS_1 | DATA_1 |
| SIGNATURE_2 | VPID_2 | VP_2 | RESULTS_2 | DATA_2 |
| ⋮ | ⋮ | ⋮ | ⋮ | ⋮ |
| SIGNATURE_n | VPID_n | VP_n | RESULTS_n | DATA_n |

FIG. 8A

| VPID 855 | VP SOURCE INFO 860 | ADDITIONAL DATA 865 | CONF. REQ. 870 |
|---|---|---|---|
| VPID_a | INFO_a | DATA_a | REQ_a |
| VPID_b | INFO_b | DATA_b | REQ_b |
| ⋮ | ⋮ | ⋮ | ⋮ |
| VPID_n | INFO_n | DATA_n | REQ_n |

FIG. 8B

MANAGING MODEL CHECKS OF SEQUENTIAL DESIGNS

BACKGROUND

1. Technical Field

The present invention relates generally to managing model checks of sequential designs, and in particular, to a computer implemented method for utilizing the cached results of prior model checking runs in a centralized persistent database.

2. Description of Related Art

As circuits have become more complex, improved methods and tools for designing, modifying, and testing those circuits have been developed. Circuits can include integrated circuits, printed circuit board circuits, and other types of circuits at a system level, sub-system level, or even at a transistor level. Improvements in circuit design include the use of electronic design automation (EDA) software tools to generate schematics of circuit designs between a logic and physical design.

Circuit designers need to test or otherwise verify their circuit designs before actually constructing a circuit from a design. A variety of software testing tools and techniques have been developed for testing circuit designs including simulation and formal verification. While simulation can be very effective, it can become very time consuming and may not be able to exhaustively test complex circuit designs due to the large number of possible test vectors, input bits and state bits used to simulate a given circuit. However, formal verification of a circuit design can be helpful in proving the correctness of those circuit designs.

Model checking is a type of formal verification where a model of a circuit design is exhaustively checked to determine whether that model meets a set of specifications. The circuit design is first compiled into a formal netlist. This formal netlist is commonly represented as a directed-acyclic graph (DAG) where nodes typically represent user and internal variables as well as operators (e.g. Boolean AND), and where edges connect the nodes (operands) to the operators. The model checking system then attempts all possible input combinations and circuit states for that model given a reset state and a property signal. All possible reachable circuit states are then mathematically identified and checked to verify that the model meets the set of specifications. Powerful Boolean engines may be utilized to assist in this process. However, a model check of a complex circuit design may take hours to run. If a circuit designer iteratively makes circuit design changes, then the circuit design iterations may need to be model checked, thereby slowing the circuit design process.

SUMMARY

The illustrative embodiments provide a method, system, and computer usable program product for model checking a first circuit model including determining whether the first circuit model is functionally equivalent to one of a set of prior circuit models stored in persistent memory, and in response to determining functional equivalence, utilizing a processor to provide test results for the functionally equivalent prior circuit model.

BRIEF DESCRIPTION OF THE SEVERAL VIEWS OF THE DRAWINGS

The novel features believed characteristic of the invention are set forth in the appended claims. The invention itself, further objectives and advantages thereof, as well as a preferred mode of use, will best be understood by reference to the following detailed description of illustrative embodiments when read in conjunction with the accompanying drawings, wherein:

DETAILED DESCRIPTION

Processes and devices may be implemented and utilized to manage model checks of sequential designs by utilizing the cached results of prior model checking in a centralized persistent database. Sequential designs refer to hardware and software system designs which have states, including clocked designs with registers/latches. Sequential designs may be referred to herein as circuit designs. These processes and apparatuses may be implemented and utilized as will be explained with reference to the various embodiments below.

Figure 1:
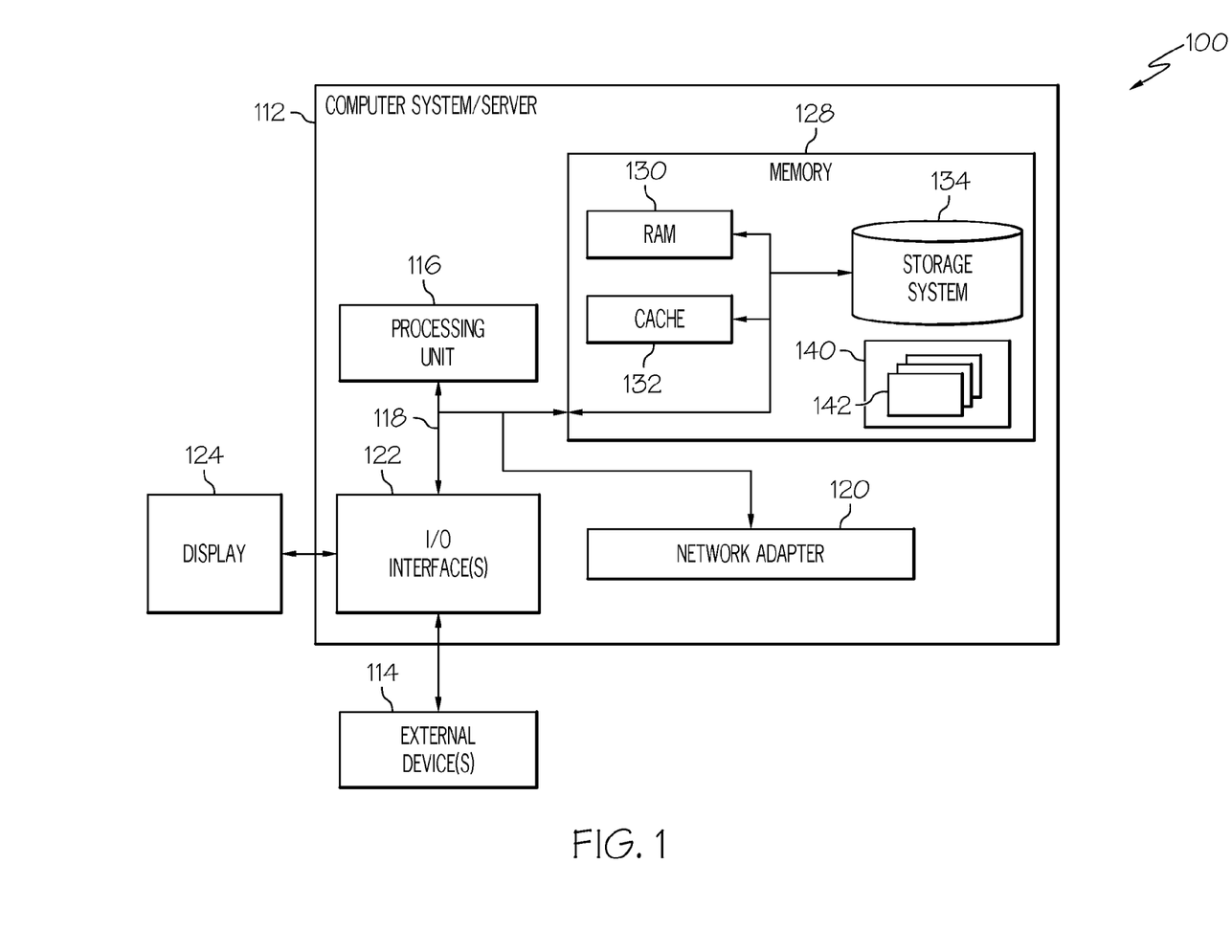
FIG. 1 is a block diagram of a data processing system in which various embodiments may be implemented.

FIG. 1 is a block diagram of a data processing system in which various embodiments may be implemented. Data processing system 100 is one example of a suitable data processing system and is not intended to suggest any limitation as to the scope of use or functionality of embodiments of the invention described herein. Regardless, data processing system 100 is capable of being implemented and/or performing any of the functionality set forth herein.

In data processing system 100 there is a computer system/server 112, which is operational with numerous other general purpose or special purpose computing system environments, peripherals, or configurations. Examples of well-known computing systems, environments, and/or configurations that may be suitable for use with computer system/server 112 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 112 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 112 may be practiced in distributed computing environments where tasks are performed by remote processing devices that are linked through a communications network. In a distributed computing environment, program modules may be located in both local and remote computer system storage media including memory storage devices.

As shown in FIG. 1, computer system/server 112 in data processing system 100 is shown in the form of a general-purpose computing device. The components of computer system/server 112 may include, but are not limited to, one or more processors or processing units 116, a system memory 128, and a bus 118 that couples various system components including system memory 128 to processor 116.

Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 112 typically includes a variety of computer system readable media. Such media may be any available media that is accessible by computer system/server 112, and it includes both volatile and non-volatile media, removable and non-removable media.

System memory 128 can include computer system readable media in the form of volatile memory, such as random access memory (RAM) 130 and/or cache memory 132. Computer system/server 112 may further include other removable/non-removable, volatile/non-volatile computer system storage media. By way of example, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 118 by one or more data media interfaces. Memory 128 may include at least one program product having a set (e.g., at least one) of program modules that are configured to carry out the functions of embodiments of the invention. Memory 128 may also include data that will be processed by a program product.

Program/utility 140, having a set (at least one) of program modules 142, may be stored in memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of embodiments of the invention. For example, a program module may be software for managing model checks of circuit designs by utilizing the cached results of prior model checking in a centralized persistent database.

Computer system/server 112 may also communicate with one or more external devices 114 such as a keyboard, a pointing device, a display 124, etc.; one or more devices that enable a user to interact with computer system/server 112; and/or any devices (e.g., network card, modem, etc.) that enable computer system/server 112 to communicate with one or more other computing devices. Such communication can occur via I/O interfaces 122 through wired connections or wireless connections. Still yet, computer system/server 112 can communicate with one or more networks such as a local area network (LAN), a general wide area network (WAN), and/or a public network (e.g., the Internet) via network adapter 120. As depicted, network adapter 120 communicates with the other components of computer system/server 112 via bus 118. It should be understood that although not shown, other hardware and/or software components could be used in conjunction with computer system/server 112. Examples, include, but are not limited to: microcode, device drivers, tape drives, RAID systems, redundant processing units, data archival storage systems, external disk drive arrays, etc.

Figure 2:
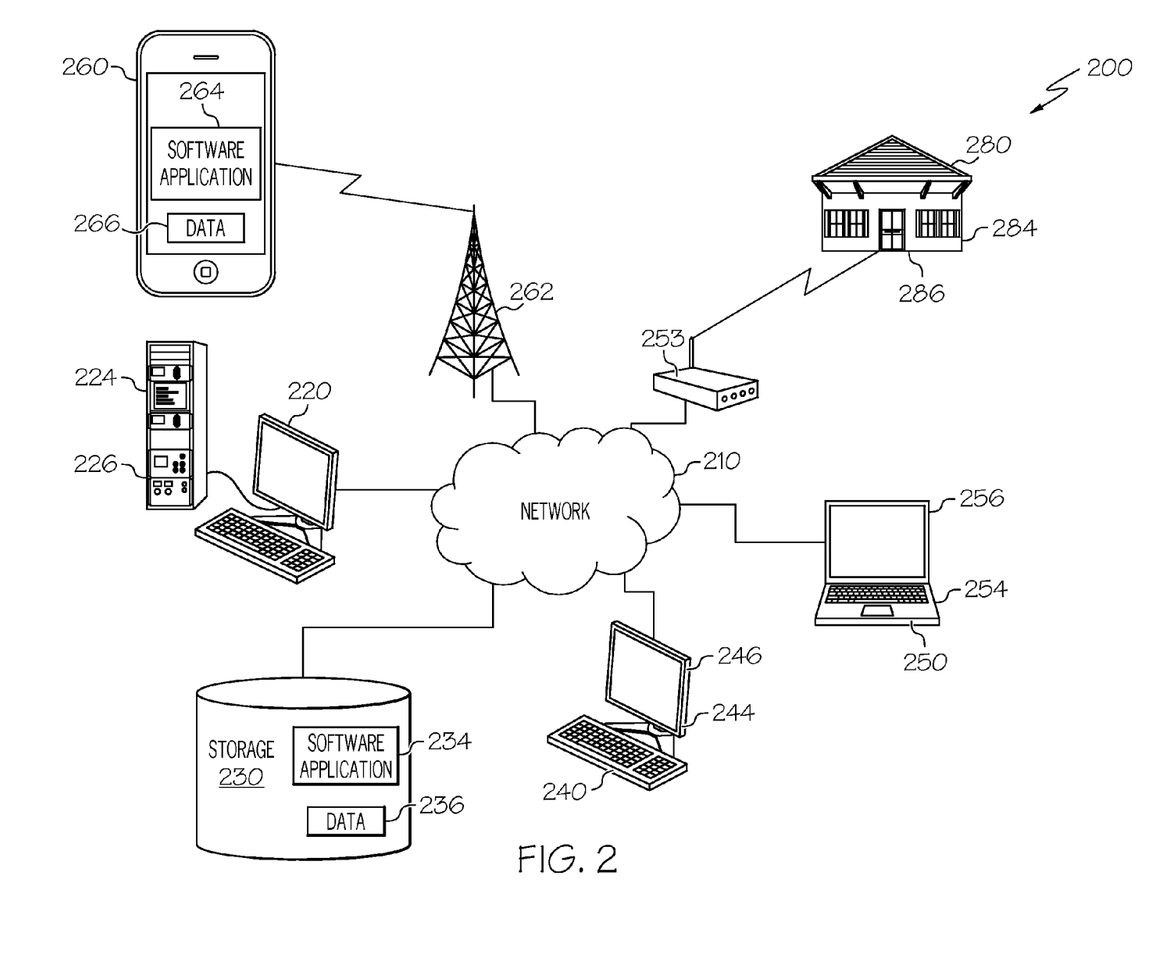
FIG. 2 is a block diagram of a network of data processing systems in which various embodiments may be implemented.

FIG. 2 is a block diagram of a network of data processing systems in which various embodiments may be implemented. Data processing environment 200 is a network of data processing systems such as described above with reference to FIG. 1. Software applications may execute on any computer or other type of data processing system in data processing environment 200. Data processing environment 200 includes network 210. Network 210 is the medium used to provide simplex, half duplex and/or full duplex communications links between various devices and computers connected together within data processing environment 200. Network 210 may include connections such as wire, wireless communication links, or fiber optic cables.

Server 220 and client 240 are coupled to network 210 along with storage unit 230. In addition, laptop 250 and facility 280 (such as a home or business) are coupled to network 210 including wirelessly such as through a network router 253. A mobile phone 260 may be coupled to network 210 through a mobile phone tower 262. Data processing systems, such as server 220, client 240, laptop 250, mobile phone 260 and facility 280 contain data and have software applications including software tools executing thereon. Other types of data processing systems such as personal digital assistants (PDAs), smartphones, tablets and netbooks may be coupled to network 210.

Server 220 may include software application 224 and data 226 for managing model checks of circuit designs by utilizing the cached results of prior model checking in a centralized persistent database or other software applications and data in accordance with embodiments described herein. Storage 230 may contain software application 234 and a content source such as data 236 for managing model checks of circuit designs by utilizing the cached results of prior model checking in a centralized persistent database. Other software and content may be stored on storage 230 for sharing among various computer or other data processing devices. Client 240 may include software application 244 and data 246. Laptop 250 and mobile phone 260 may also include software applications 254 and 264 and data 256 and 266. Facility 280 may include software applications 284 and data 286. Other types of data processing systems coupled to network 210 may also include software applications. Software applications could include a web browser, email, or other software application that can manage model checks of circuit designs by utilizing the cached results of prior model checking in a centralized persistent database.

Server 220, storage unit 230, client 240, laptop 250, mobile phone 260, and facility 280 and other data processing devices may couple to network 210 using wired connections, wireless communication protocols, or other suitable data connectivity. Client 240 may be, for example, a personal computer or a network computer.

In the depicted example, server 220 may provide data, such as boot files, operating system images, and applications to client 240 and laptop 250. Server 220 may be a single computer system or a set of multiple computer systems working together to provide services in a client server environment. Client 240 and laptop 250 may be clients to server 220 in this example. Client 240, laptop 250, mobile phone 260 and facility 280 or some combination thereof, may include their own data, boot files, operating system images, and applications. Data processing environment 200 may include additional servers, clients, and other devices that are not shown.

In the depicted example, data processing environment 200 may be the Internet. Network 210 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 200 also may be implemented as a number of different types of networks, such as for example, an intranet, a local area network (LAN), or a wide area network (WAN). FIG. 2 is intended as an example, and not as an architectural limitation for the different illustrative embodiments.

Among other uses, data processing environment 200 may be used for implementing a client server environment in which the embodiments may be implemented. A client server environment enables software applications and data to be distributed across a network such that an application functions by using the interactivity between a client data processing system and a server data processing system. Data processing environment 200 may also employ a service oriented architecture where interoperable software components distributed across a network may be packaged together as coherent business applications.

Figure 3:
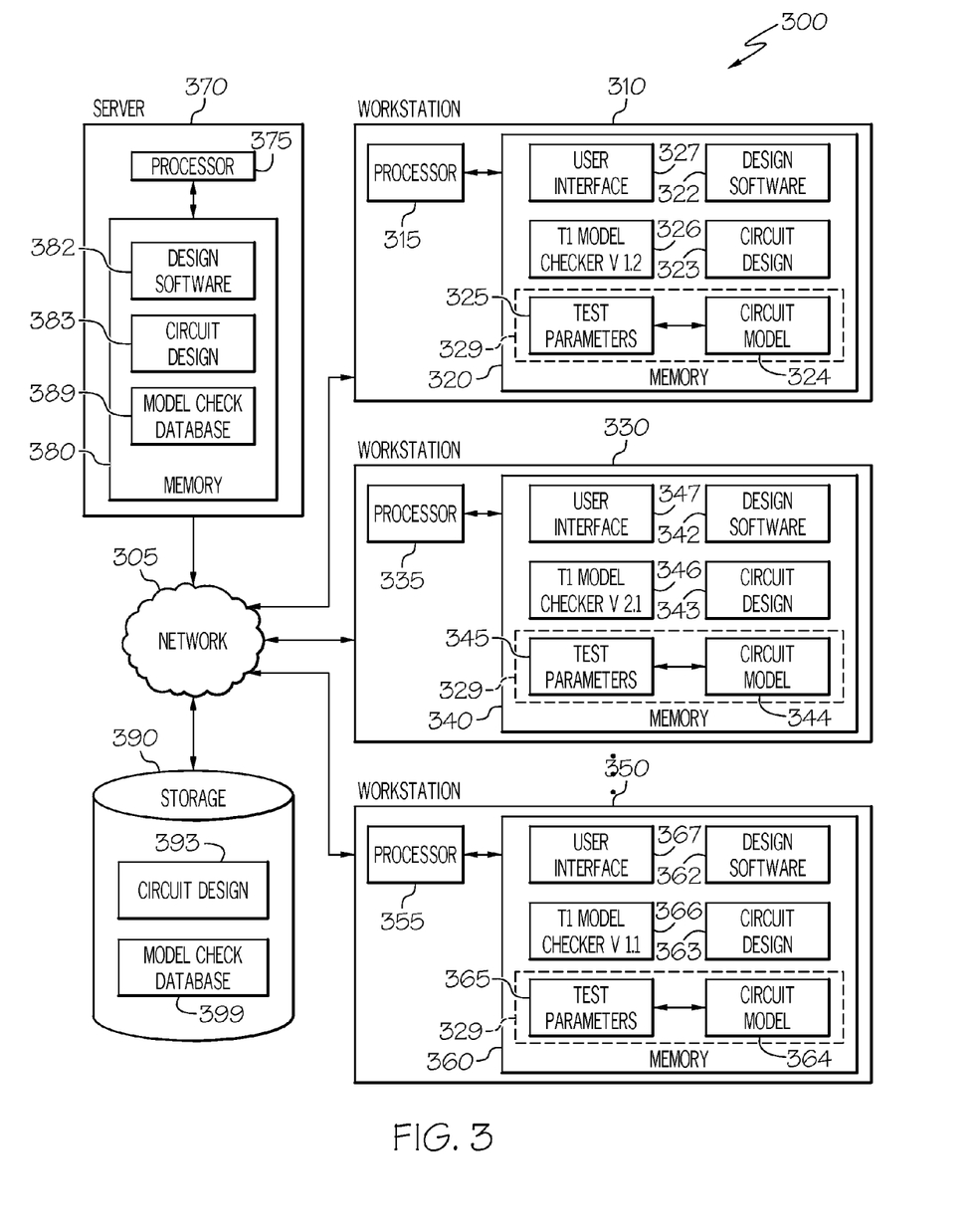
FIG. 3 is a block diagram of a network of workstations in which various embodiments may be implemented.

FIG. 3 is a block diagram of a network of workstations 300 in which various embodiments may be implemented. Three different workstations 310, 330 and 350 are shown with a server 370 and a storage unit 390. Additional workstations, servers, and storage units may be utilized. Circuit design engineers and other users may work on workstations when designing a circuit such as a semiconductor device. These workstations communicate with server 370 and storage unit 390 across a network 305 using wired connections, wireless communication protocols, or other suitable data connectivity. Network 305 may represent an intranet, a local area network (LAN), a wide area network (WAN), or the internet.

Workstation 310 includes a processor 315 in communication with a memory 320, the memory storing certain software and data for processing by the processor. Memory 320 is shown with design software 322, a circuit design 323, a circuit model 324, a verification problem 329, a type 1 (T1) model check software version 1.2 326, and a user interface 327. These programs may be locally stored or they may be local instances of software stored at server 370, in storage 390, or at other locations such as on the cloud. Design software 322 is used to design or modify circuit design 323. Circuit design 323 may be designed or modified using one of several hardware description languages for describing the circuit. Circuit design 323 may be a discrete portion of a circuit or a whole circuit being designed or modified. For example, a microprocessor being designed may include multiple cores, each core including one or more arithmetic logic units (ALUs). In this example, a circuit designer may be working on designing or modifying a design of a microprocessor, a core, or an ALU.

Model checker 326 is used to generate circuit model 324 from circuit design 323 and to generate test parameters 325. Circuit model 324 is a formal netlist of the circuit design suitable for model checking. Test parameters 325 include a set of reset states of the circuit model and a set of states corresponding to the set of desired properties (i.e. property signals) as set forth by the set of specifications for model checking the circuit design. Together, circuit model 324 and test parameters 325 form a verification problem (VP) 329. Although the circuit model and test parameters are shown separately in this example, alternative embodiments may combine some or all of the test parameters into the formal netlist to generate an integrated verification problem. Type 1 model checker v 1.2 326 is a specific version of a certain type of model checker. There are several types of model checkers written by various software companies. Model checker 326 is used for verifying that the circuit model meets certain specifications, thereby verifying that the underlying circuit design meets those specifications. User interface 327 interacts with the user to utilize the software described above including determining whether the circuit model or an equivalent was previously tested by a model checker.

Workstations 330 and 350 are similar to workstation 310 except that different types or versions of software may be utilized to perform the same or similar functions. Each workstation has a processor 335 and 355 in communication with a memory 340 and 360, each memory storing certain software and data for processing by the processor. Memory 340 and 360 includes design software 342 and 362, circuit design 343 and 363, circuit model 344 and 364, test parameters 345 and 365, model checker 346 and 366, and user interface 347 and 367 with the circuit models and test parameters forming verification problem (VP) 349 and 369. Each of these workstations may be working on the same circuit design, a discrete portion thereof, or different circuit designs. In this example, workstation 330 has the same type of model checker, but a different version (version 2.1), and workstation 350 has a different type of model checker (type 2, version 1.2).

Server 370 may be in the same network environment as workstations 310, 330, and 350, or it may be across the internet, or in a cloud environment. Server 370 includes a processor 375 in communication with memory 380, the memory storing certain software and data for processing by the processor. Memory 380 is shown with design software 382, a circuit design 383, and a model checking database 389. Design software 382 may be a software product that various workstations may utilize in a client server environment or across a cloud environment. Circuit design 383 may be a master copy of the circuit design, or a discrete portion thereof, being worked on by each workstation.

Model checking database is a persistent database of the cached results of prior model checking. It can respond to inquiries from various workstations to help determine whether a certain circuit model was previously tested with model checking software. If so, then the prior results may be provided to the workstation making the inquiry, thereby enabling that workstation to avoid retesting the same or equivalent circuit model.

Storage 390 is a centralized storage device and may be in the same network as workstations 310, 330, and 350, or it may be across the internet, or in a cloud environment. Given server 370, storage 390 may not be needed, or it may supplement or backup server 370. Storage 390 may include circuit design 393 and model checking database 399.

Figure 4:
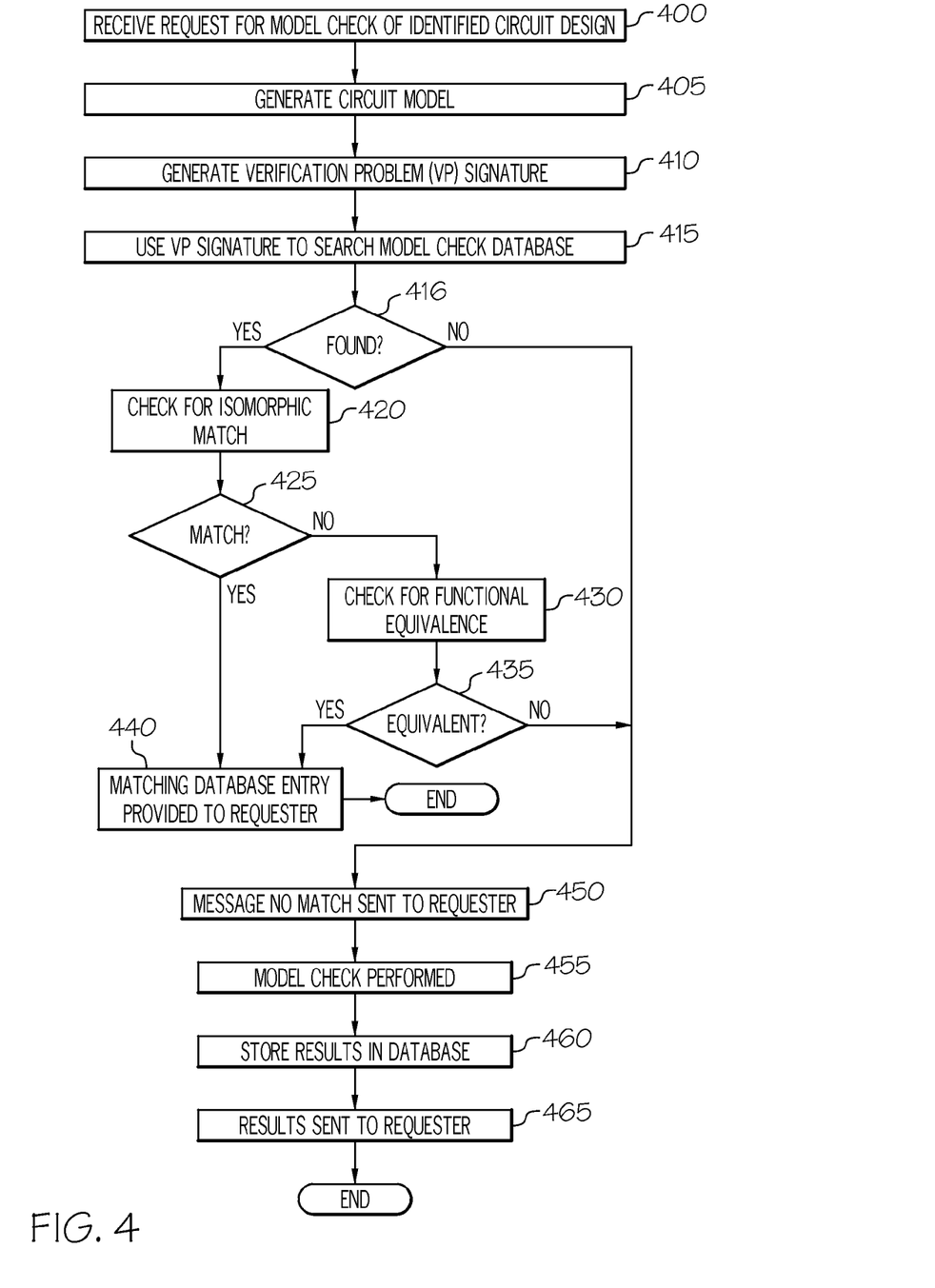
FIG. 4 is a flow diagram of the operation of a workstation performing model checking of a circuit design in accordance with a first embodiment.

FIG. 4 is a flow diagram of the operation of a workstation performing model checking of a circuit design in accordance with a first embodiment. In a first step 400, a request is received from a circuit designer or other responsible party to perform a model check of an identified circuit design. This request includes a set of test parameters for the model checker to use when performing a model check of the identified circuit design. The test parameters may be a reset state and a property signal to be tested. In a second step 405, the model checker generates a circuit model (e.g. a formal netlist) from the identified circuit design. The circuit model is combined with the test parameters, thereby providing a verification problem to be solved. In some cases the test parameters may be integrated with the circuit model and other cases they may not be integrated, depending on the model check software.

In a third step 410, a signature of the verification problem is generated. The signature is to limit the number of entries in a model check database (i.e. prior verification problems) that are compared with the signature for determining whether this verification problem has been performed before. The signature may be determined from the circuit model and may include elements of the test parameters. The signature may include one or more of the following: number of sequential elements, number of input signals, and a hash value created from the graph, test parameter reset states, etc. The signature should not include variables that may exclude isomorphically matching or functionally equivalent verification problems. Alternative signatures may utilize different variables from the verification problem and different methods of combining those elements. In step 415, the signature of the circuit model is used to search the model check database for one or more matches. In step 416, the result of this search is used to determine next steps. If a match is found, then processing continues to step 420, otherwise processing continues to step 450.

In step 420, the circuit model of each database entry with a matching signature is then compared to the current validation problem circuit model to be tested. In this embodiment, the comparison is a graph isomorphic check. For example, the circuit models in the database are compared to the circuit model being tested by determining whether they have the same directed-acyclic graph (DAG) structure with the same graph nodes and the same edges incident on the graph nodes. The current validation problem test parameters are also compared with the test parameters of the database entry with the matching signature to determine whether they match in part or in whole. In particular, if the current test reset states match the resent states of database entry, then it is considered a test parameter match. An example of an isomorphic graph match is shown with reference to FIG. 6 below. In step 425, processing is redirected based on this comparison. If there is an isomorphic match with matching test parameters, then processing continues to step 440, otherwise processing continues to step 430.

In step 430, the circuit model of each database entry with a matching signature is then again compared to the current validation problem circuit model to be tested. The comparison is a combinational equivalence check, which is more general and robust that an isomorphic check. That is, the circuit models in the database are compared to the circuit model being tested by determining whether they are functionally equivalent. An example of a combinational equivalence match is shown with reference to FIG. 6 below. The current validation problem test parameters are also compared with the test parameters of the database entry with the matching signature to determine whether they match in part or in whole. In particular, if the current test reset states match the resent states of database entry, then it is considered a test parameter match. In step 435, processing is redirected based on this comparison. If there is a combinational equivalence match with matching test parameters, then processing continues to step 440, otherwise processing continues to step 450.

In step 440, the corresponding results of the matching database entry(ies) is obtained from the model check database and provided to the requester of the model check and processing ends. As a result, the requester is provided the desired results while avoiding the time and cost of performing a duplicative full model check. Optionally, the requester may continue testing the validation problem upon request. For example, the requester may need test information not stored in the database or the requester may want to verify different property signals not previously tested.

In step 450, a message is sent to the requester that there is no match in the model check database with the circuit design to be tested. Processing then continues to step 455 where a model check is performed on the circuit design. Subsequently in step 460, the verification problem (i.e. the circuit model and test parameters), a signature of the verification problem, and the results of the model check is stored in the model check database. As a result, the model check database is improved with another entry. Then in step 465, the model check test results are sent to the requester and processing ends. Whether the requester receives a previously stored copy of test results or a model check is performed, the underlying circuit design may then be utilized in manufacturing a semiconductor device.

Figure 5:
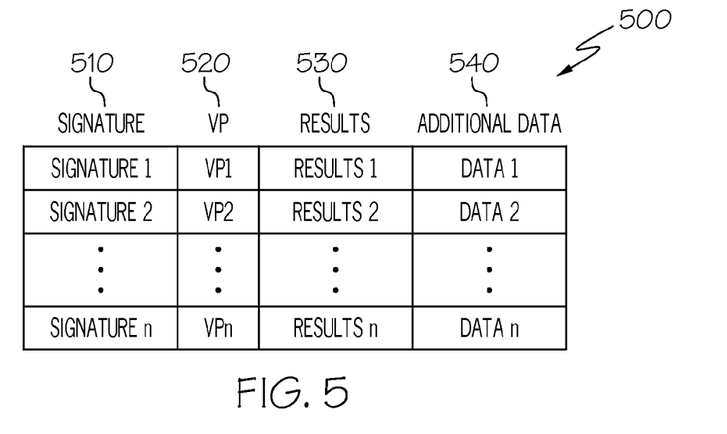
FIG. 5 is a block diagram of a model check database in accordance with a first embodiment.

FIG. 5 is a block diagram of a model check database 500 in accordance with a first embodiment. Model check database 500 includes an entry for each prior model check stored in the database, each entry including several corresponding elements including signature 510, verification problem 520, results 530, and additional data 540. This example includes n entries, with the first, second and last entry shown.

Signature 510 is used to identify the database entry that might match a circuit model to be model checked or otherwise tested. The signature may be determined from the circuit model and may include elements of the test parameters. The signature may include one or more of the following: number of sequential elements, number of input signals, and a hash value created from the graph. The signature may include one or more of the following: the number of sequential elements, number of input signals, a hash value created from the graph, test parameter reset states, etc. The signature should not include variables that may exclude isomorphically matching or functionally equivalent verification problems. Alternative signatures may utilize different variables from the verification problem and different methods of combining those elements. The signature should include elements that do not vary when an equivalent circuit model is compared for isomorphic or functional equivalency. The signature is then hashed to generate a single number that is easy to use to index the database.

Verification problem 520 includes the corresponding circuit model and the test parameters for a previously tested circuit design. After matching a signature, this information is used to verify whether the prior verification problem matches the requested verification problem. Circuit models may be standardized prior to storage in the database. For example, although there is a standard netlist called AIGER (And-Inverter Graphs) used for model checking, alternative circuit models netlist types exist including different versions of AIGER. For ease of use and ease of access, a common circuit model netlist may be utilized for storage in the database as part of a verification problem. In the case where the circuit model may be translated to meet a standard, the original circuit model may also be stored under additional data 540 described below.

Results 530 include the corresponding results of prior circuit model testing that would be needed by a requestor testing a circuit design. This would include whether the prior test passed or failed, a witness, a counter example, and a strategy. A witness contains a sequence of Boolean values at primary inputs of the design for which the property (or properties) being verified holds. A counter example contains a sequence of Boolean values at primary inputs of the design for which the property (or properties) being verified fail. A strategy includes combinations of solver algorithms to invoke, memory and runtime limits for the solver algorithms. Since the database entry results are provided in lieu of an actual test, the results information should be as exhaustive as practical. Additional data 540 includes information such as the date of the database entry, the model checker tool type and version number used, etc. This is additional information regarding a prior test that would be needed by a requestor testing a circuit design. However, even if a different model checker or model checker version was used previously, the results may still be very useful to the requestor.

Figure 6A:
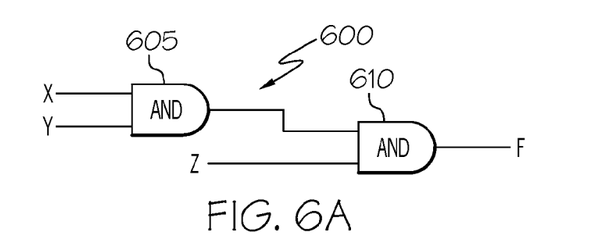
FIGS. 6A, 6B and 6C are block diagrams of equivalent circuits in which various embodiments may be implemented.
Figure 6B:
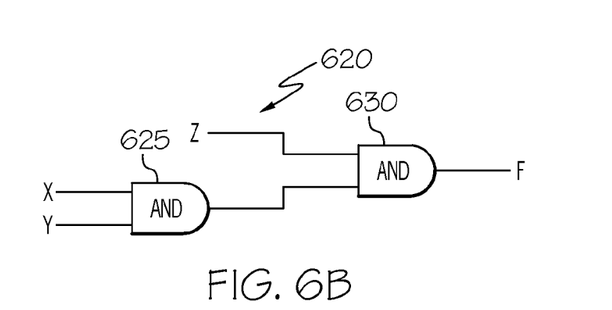

FIGS. 6A, 6B and 6C are block diagrams of equivalent circuits in which various embodiments may be implemented. In FIG. 6A, a first circuit 600 is shown with three inputs x, y and z, one output F, and two AND gates 605 and 610. FIG. 6B is a diagram of an isomorphically equivalent circuit 620 with inputs z, x and y, output F, and two AND gates 625 and 630. Although the inputs and gates in different positions from that shown in FIG. 6A, they are isomorphic to each other due to their equivalent structures.

Figure 6C:
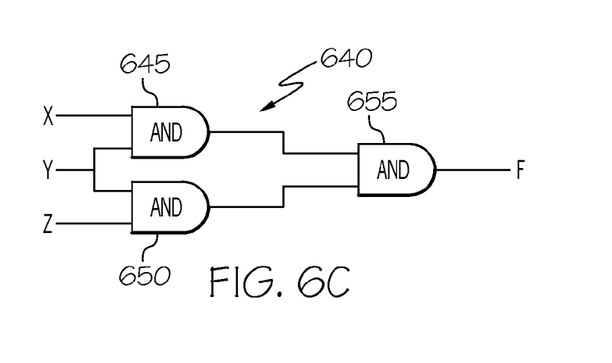

FIG. 6C is a diagram of a functionally equivalent circuit 640 with three inputs x, y and z, one output F, and three AND gates 645, 650 and 655. Clearly circuit 640 is not isomorphic with circuits 600 or 620 due to the different number of gates and different interconnections between inputs and gates. However, circuit 640 is functionally equivalent to circuits 600 and 620. This is because the same inputs will always result in the same output for all three circuits. As a result, they are combinational equivalents of each other.

Figure 7:
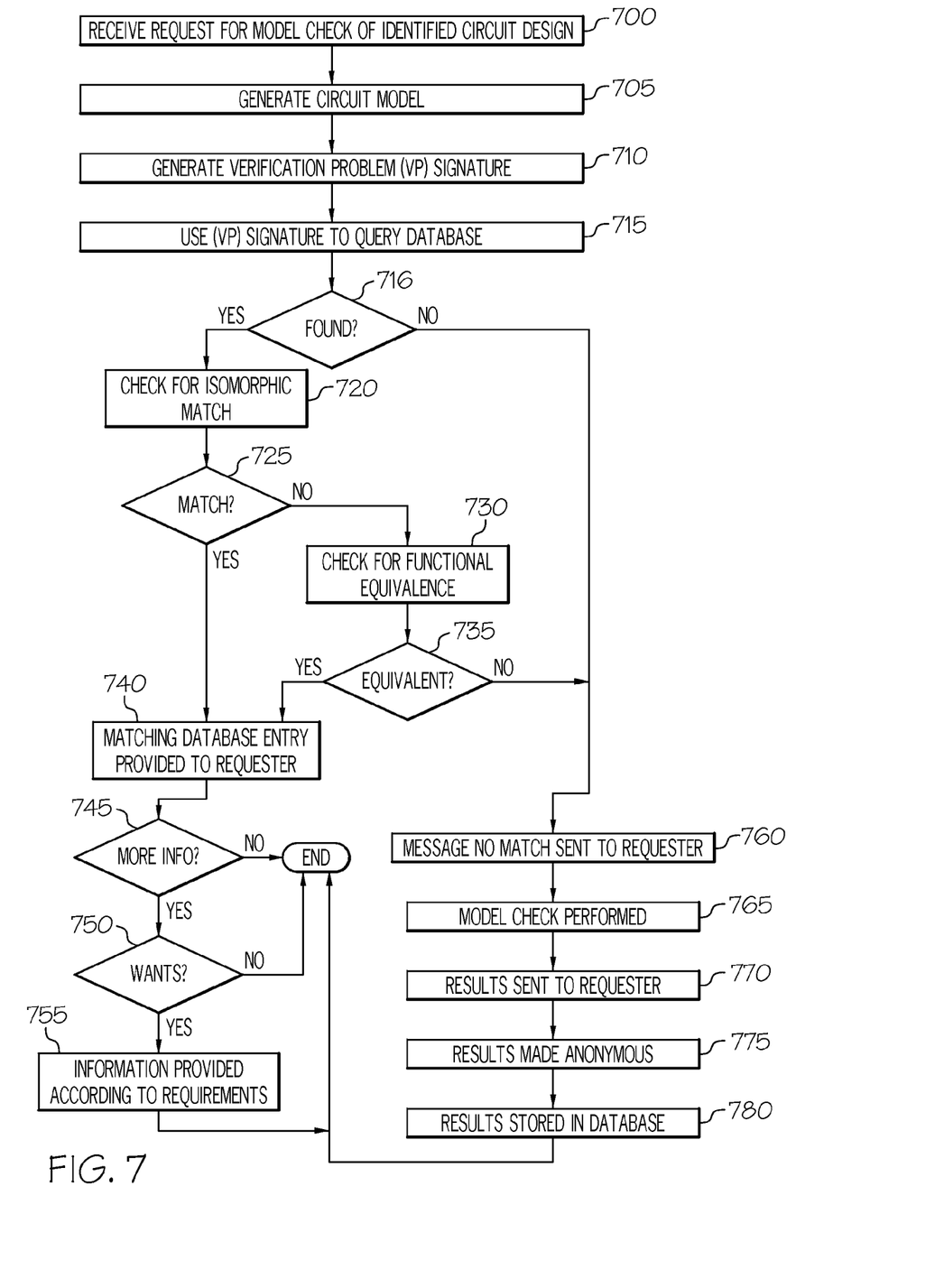
FIG. 7 is a flow diagram of the operation of a workstation and model check database server performing model checking of a circuit design in accordance with a second embodiment.

FIG. 7 is a flow diagram of the operation of a workstation and model check database server performing model checking of a circuit design in accordance with a second embodiment. This embodiment is directed to a centralized model checking database which may be accessed by multiple enterprises while maintaining confidentiality, or which may be accessed within an enterprise where certain circuit design projects need to be segregated and kept confidential from other circuit design projects, yet the test results may be shared anonymously. The circuit design may be stored within the enterprise, but the model checking database or the anonymous portion thereof may be stored at a central location for multiple enterprises to access as needed.

In a first step 700, a request is received from a circuit designer or other responsible party to perform a model check of an identified circuit design. This request includes a set of test parameters for the model checker to use when performing a model check of the identified circuit design. The test parameters may be a reset state and a property signal to be tested. In a second step 705, the model checker generates a circuit model (e.g. a formal netlist) from the identified circuit design. The circuit model is combined with the test parameters, thereby providing a verification problem to be solved. In some cases the test parameters may be integrated with the circuit model and other cases they may not be integrated, depending on the model check software.

In a third step 710, a signature of the verification problem is generated. The signature is to limit the number of entries in a model check database (i.e. prior verification problems) that are compared with the signature for determining whether this verification problem has been performed before. The signature may be determined from the circuit model and may include elements of the test parameters. The signature may include one or more of the following: number of sequential elements, number of input signals, and a hash value created from the graph, test parameter reset states, etc. The signature should not include variables that may exclude isomorphically matching or functionally equivalent verification problems. Alternative signatures may utilize different variables from the verification problem and different methods of combining those elements. In step 715, the signature of the circuit model is used to query the centrally stored model check database for one or more matches. The query can identify the requestor, the enterprise, division or entity where the requester is located, any confidentiality requirements of the requestor or the requestor's entity, and any confidentiality privileges the requestor may have. In step 716, the result of this search is used to determine next steps. If a signature match is found, then processing continues to step 720, otherwise processing continues to step 760.

In step 720, the circuit model of each database entry with a matching signature is then compared to the current validation problem circuit model to be tested. In this embodiment, the comparison is a graph isomorphic check. For example, the circuit models in the database are compared to the circuit model being tested by determining whether they have the same directed-acyclic graph (DAG) structure with the same graph nodes and the same edges incident on the graph nodes. The current validation problem test parameters are also compared with the test parameters of the database entry with the matching signature to determine whether they match in part or in whole. In particular, if the current test reset states match the reset states of database entry, then it is considered a test parameter match. An example of an isomorphic graph match is shown with reference to FIG. 6 above. In step 725, processing is redirected based on this comparison. If there is an isomorphic match with matching test parameters, then processing continues to step 740, otherwise processing continues to step 730.

In step 730, the circuit model of each database entry with a matching signature is then again compared to the current validation problem circuit model to be tested. The comparison is a combinational equivalence check, which is more general and robust that an isomorphic check. That is, the circuit models in the database are compared to the circuit model being tested by determining whether they are functionally equivalent. An example of a combinational equivalence match is shown with reference to FIG. 6 above. The current validation problem test parameters are also compared with the test parameters of the database entry with the matching signature to determine whether they match in part or in whole. In particular, if the current test reset states match the reset states of database entry, then it is considered a test parameter match. In step 735, processing is redirected based on this comparison. If there is a combinational equivalence match with matching test parameters, then processing continues to step 740, otherwise processing continues to step 760.

In step 740, the corresponding results of the matching database entry(ies) is obtained from the model check database and provided to the requester of the model check before processing continues to step 745. As a result, the requester is provided the desired results while avoiding the time and cost of performing a duplicative full model check. Optionally, the requester may continue testing the validation problem upon request. For example, the requester may need test information not stored in the database or the requester may want to verify different property signals not previously tested.

In step 745, it is determined whether the requester is allowed access to additional information in the model check database. This is based on the enterprise, division or entity the requester is from, any special privileges that requestor may have within that enterprise, division, or entity the confidentiality restrictions on the data in the model check database, etc. If no more information is allowed, then processing ceases, otherwise processing continues to step 750. In step 750 the requester is queried whether he or she wants that additional information. If not, then processing ends, otherwise in step 755 any additional information in the model check database related to the previous test is provided to the requestor in accordance with applicable confidentiality requirements before processing ceases. In an alternative embodiment, the requestor may be provided the additional information allowed without needing a query. In another alternative embodiment, the requestor may be provided the VP identifier so the requestor can access any additional information related to that VP identifier within the requestor's enterprise, division or other entity.

In step 760, a message is sent to the requester that there is no match in the model check database with the circuit design to be tested. Processing then continues to step 765 where a model check is performed on the circuit design. Subsequently in step 770, the model check test results are sent to the requester before continuing to step 775. In step 775, the verification problem (i.e. the circuit model and test parameters), a signature of the verification problem, and the results of the model check are made anonymous. Then in step 780, the anonymous data is stored in the model check database with a unique VP identifier before processing ceases. Any confidential information is stored with the unique VP identifier in a separate database for security purposes. The confidential information may be stored at the central location of the model check database or within the confines of the enterprise, division or other entity where the circuit design originated. As a result, the model check database is improved with another entry while anonymity and security is maintained. Whether the requester receives a previously stored copy of test results or a model check is performed, the underlying circuit design may then be utilized in manufacturing a semiconductor device.

Figure 8A:
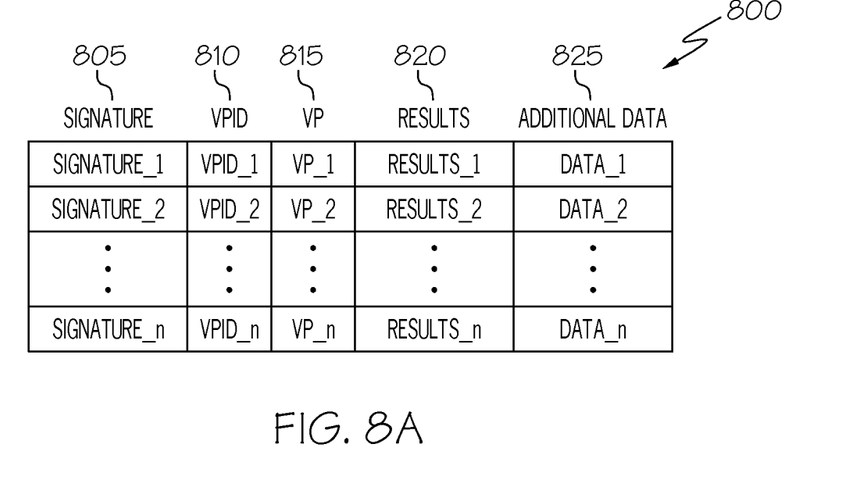
FIGS. 8A and 8B are block diagrams of a model check database in accordance with a second embodiment.
Figure 8B:
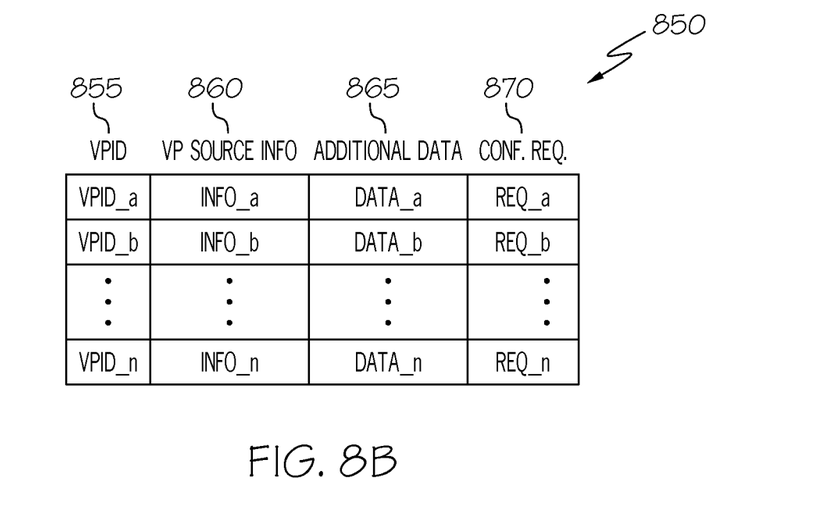

FIGS. 8A and 8B are block diagrams of a model check database in accordance with a second embodiment. FIG. 8A is a block diagram of an anonymous model check test results database 800 referred to herein as an anonymous database and FIG. 8B is a block diagram of a confidential model check test results database 850 referred to herein as a confidential database. Anonymous database 800 may be stored at a central location accessible by multiple entities. Confidential database 850 may be stored centrally with security precautions, or portions of it may be stored at each entity where the confidential data originated.

Anonymous model check test results database 800 includes an entry for each prior model check stored in the database, each entry including several corresponding elements including signature 805, verification problem identifier 810, verification problem 815, anonymous results 820, and additional anonymous data 825. This example includes n entries, with the first, second and last entry shown.

Signature 805 is used to identify the database entry that might match a circuit model to be model checked or otherwise tested. The signature may be determined from the circuit model and may include elements of the test parameters. The signature may include one or more of the following: number of sequential elements, number of input signals, and a hash value created from the graph. The signature may include one or more of the following: the number of sequential elements, number of input signals, a hash value created from the graph, test parameter reset states, etc. The signature should not include variables that may exclude isomorphically matching or functionally equivalent verification problems. Alternative signatures may utilize different variables from the verification problem and different methods of combining those elements. The signature should include elements that do not vary when an equivalent circuit model is compared for isomorphic or functional equivalency. The signature is then hashed to generate a single number that is easy to use to index the database.

Verification Problem identifier (VPID) 810 is a unique identifier utilized to identify a specific verification problem and to act as a cross reference between anonymous database 800 and confidential database 850. The VPID may be generated by the server that holds the anonymous database. The VPID may be sequentially generated or randomly generated and then cross checked with other VPIDs to ascertain its novelty. The VPID should not identify the enterprise, division or entity of origin for security purposes.

Verification problem 815 includes the corresponding circuit model and the test parameters for a previously tested circuit design. After matching a signature, this information is used to verify whether the prior verification problem matches the requested verification problem. Circuit models may be standardized prior to storage in the database. For example, although there is a standard netlist called AIGER (And-Inverter Graphs) used for model checking, alternative circuit models netlist types exist including different versions of AIGER. For ease of use and ease of access, a common circuit model netlist may be utilized for storage in the database as part of a verification problem. In the case where the circuit model may be translated to meet a standard, the original circuit model may also be stored under additional data 540 described below.

Anonymous results 820 include the corresponding results of prior circuit model testing that would be needed by a requestor testing a circuit design, yet do not disclose the source of the underlying circuit design or any other confidential information. This would include whether the prior test passed or failed, a witness, a counter example, and a strategy. A witness contains a sequence of Boolean values at primary inputs of the design for which the property (or properties) being verified holds. A counter example contains a sequence of Boolean values at primary inputs of the design for which the property (or properties) being verified fail. A strategy includes combinations of solver algorithms to invoke, memory and runtime limits for the solver algorithms. Since the database entry results are provided in lieu of an actual test, the results information should be as exhaustive as practical. Additional anonymous data 825 includes anonymous information such as the date of the database entry, the model checker tool type and version number used, etc. This is additional information regarding a prior test that would be needed by a requestor testing a circuit design.

Confidential model check test results database 850 includes an entry for each prior model check stored in the database, each entry including several corresponding elements including verification problem identifier (VPID) 855, verification problem source information 860, confidentiality requirements 870, and additional data 865. This example includes n entries, with the first, second and last entry shown.

VPID 855 is the same as VPID 810, except that the list of VPIDs 855 in the confidential database may be specific to one enterprise, division, or other entity if the confidential database is stored locally rather than at the central location of the anonymous database. Verification problem source information 860 includes confidential information regarding the source of the tested circuit design such as the requestor of that test, the circuit or product applicable to the tested circuit, etc. Additional data 865 includes any additional confidential information that would be needed by a requestor testing a circuit design. Confidential requirements 870 includes any confidentiality requirements with regards to the test results such as who may access those results, the time period of confidentiality, the scope of confidentiality, etc.

The invention can take the form of an entirely software embodiment, or an embodiment containing both hardware and software elements. In a preferred embodiment, the invention is implemented in software or program code, which includes but is not limited to firmware, resident software, and microcode.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM), or Flash memory, an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code such as for managing model checks of circuit designs by utilizing the cached results of prior model checking in a centralized persistent database. A client data processing system may download that computer usable code, such as for storing on a data storage medium associated with the client data processing system, or for using in the client data processing system. The server data processing system may similarly upload computer usable code from the client data processing system such as a content source. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of model checking a first circuit model of a first circuit design comprising:
   receiving a request from a user for a model check of the first circuit model including a set of test parameters of the model check to verify the first circuit model meets a set of specifications thereby verifying the circuit design meets specifications;
   responsive to receiving the user request, utilizing a processor to generate a first signature of the requested first circuit model and a subset of the test parameters to verify the first circuit model meets the set of specifications;
   utilizing the generated first signature to identify a potentially equivalent subset of prior circuit models from a database of signatures of previously tested prior circuit models stored in memory with corresponding prior test parameters and test results for each of the previously tested prior circuit models;
   utilizing the processor to determine whether the requested first circuit model is functionally equivalent to one of the identified subset of prior circuit models; and
   in response to determining functional equivalence, utilizing the processor to provide the corresponding prior test results for the functionally equivalent prior circuit model to the user for use as model check results of the first circuit model.

2. The method of claim 1 further comprising utilizing the processor to perform a model check of the first circuit model in accordance with the set of test parameters to verify the first circuit model meets the set of specifications when a functional equivalent model is not found in the subset of prior circuit models.

3. The method of claim 2 further comprising:
   utilizing the processor to determine whether the first circuit model is isomorphically equivalent to one of the subset of prior circuit models previously tested and stored in persistent memory; and
   in response to determining isomorphic equivalence, utilizing the processor to provide the corresponding prior test results for the isomorphically equivalent prior circuit model;
   wherein the step of utilizing the processor to perform the model check of the first circuit model is performed in response to a negative determination of functional and isomorphic equivalence.

4. The method of claim 3 wherein the step of determining whether the first circuit model is isomorphically equivalent to one of the subset of prior circuit models is performed prior to the step of determining whether the first circuit model is functionally equivalent to one of the subset of prior circuit models.

5. The method of claim 3 further comprising:
   hashing the first signature for indexing the first circuit model in the database of previously tested prior circuit models;
   wherein identifying a potentially equivalent subset of prior circuit models includes determining whether the hashed first signature matches a prior hashed signature of one of the subset of prior circuit models; and
   wherein each prior circuit model is stored with a corresponding prior hashed signature in persistent memory.

6. The method of claim 5 wherein the step of signature matching is performed prior to the steps of determining isomorphic equivalence and functional equivalence, and wherein the step of utilizing the processor to perform a model check of the first circuit model is performed in accordance with the set of test parameters in response to a negative determination of signature matching.

7. The method of claim 3 wherein the circuit model is generated from a circuit design.

8. The method of claim 7 further comprising manufacturing a semiconductor device based on the circuit design.

9. A computer usable program product comprising a computer usable persistent storage medium including computer usable code for use in model checking a first circuit model, the computer usable program product comprising code for performing the steps of:
   receiving a request from a user for a model check of the first circuit model including a set of test parameters of the model check to verify the first circuit model meets a set of specifications thereby verifying the circuit design meets specifications;
   responsive to receiving the user request, utilizing a processor to generate a first signature of the requested first circuit model and a subset of the test parameters to verify the first circuit model meets the set of specifications;
   utilizing the generated first signature to identify a potentially equivalent subset of prior circuit models from a database of signatures of previously tested prior circuit models stored in memory with corresponding prior test parameters and test results for each of the previously tested prior circuit models;
   utilizing the processor to determine whether the requested first circuit model is functionally equivalent to one of the identified subset of prior circuit models; and
   in response to determining functional equivalence, utilizing the processor to provide the corresponding prior test results for the functionally equivalent prior circuit model to the user for use as model check results of the first circuit model.

10. The computer usable program product of claim 9 further comprising utilizing the processor to perform a model check of the first circuit model in accordance with the set of test parameters to verify the first circuit model meets the set of specifications when a functional equivalent model is not found in the subset of prior circuit models.

11. The computer usable program product of claim 10 further comprising:
utilizing the processor to determine whether the first circuit model is isomorphically equivalent to one of the subset of prior circuit models previously tested and stored in persistent memory; and
in response to determining isomorphic equivalence, utilizing the processor to provide the corresponding prior test results for the isomorphically equivalent prior circuit model;
wherein the step of utilizing the processor to perform the model check of the first circuit model is performed in response to a negative determination of functional and isomorphic equivalence.

12. The computer usable program product of claim 11 wherein the step of determining whether the first circuit model is isomorphically equivalent to one of the subset of prior circuit models is performed prior to the step of determining whether the first circuit model is functionally equivalent to one of the subset of prior circuit models.

13. The computer usable program product of claim 11 further comprising:
hashing the first signature for indexing the first circuit model in the database of previously tested prior circuit models;
wherein identifying a potentially equivalent subset of prior circuit models includes determining whether the hashed first signature matches a prior hashed signature of one of the subset of prior circuit models; and
wherein each prior circuit model is stored with a corresponding prior hashed signature in persistent memory.

14. The computer usable program product of claim 13 wherein the step of signature matching is performed prior to the steps of determining isomorphic equivalence and functional equivalence, and wherein the step of utilizing the processor to perform a model check of the first circuit model is performed in accordance with the set of test parameters in response to a negative determination of signature matching.

15. The computer usable program product of claim 11 wherein the circuit model is generated from a circuit design.

16. A data processing system for model checking a first circuit model, the data processing system comprising:
a processor; and
a persistent memory storing program instructions which, when executed by the processor and upon receiving a request from a user for a model check of the first circuit model including a set of test parameters of the model check to verify the first circuit model meets a set of specifications thereby verifying the circuit design meets specifications, generating a first signature of the requested first circuit model and a subset of the test parameters to verify the first circuit model meets the set of specifications, utilizing the generated first signature to identify a potentially equivalent subset of prior circuit models from a database of signatures of previously tested prior circuit models stored in memory with corresponding prior test parameters and test results for each of the previously tested prior circuit models, determine whether the requested first circuit model is functionally equivalent to one of the identified subset of prior circuit models, and if functional equivalence is shown, utilizing the processor to provide the corresponding prior test results for the functionally equivalent prior circuit model to the user for use as model check results of the first circuit model.

17. The data processing system of claim 16 further comprising program instructions stored in persistent memory which when executed by the processor perform a model check of the first circuit model in accordance with the set of test parameters to verify the first circuit model meets the set of specifications when a functional equivalent model is not found in the subset of prior circuit models.

18. The data processing system of claim 17 further comprising program instructions stored in memory which when executed by the processor:
utilizing the processor to determine whether the first circuit model is isomorphically equivalent to one of the subset of prior circuit models previously tested and stored in persistent memory, and if isomorphic equivalence is shown, utilizing the processor to provide the corresponding prior test results for the isomorphically equivalent prior circuit model;
wherein the program instructions, which when executed by the processor perform a model check of the first circuit model in accordance with the set of test parameters when a functional equivalent model is not found in the subset of prior circuit models, also perform a model check of the first circuit model when an isomorphic equivalent model is not found in the subset of prior circuit models.

19. The data processing system of claim 18 further comprising program instructions stored in persistent memory which when executed by the processor:
hash the first signature for indexing the first circuit model in the database of previously tested prior circuit models;
wherein identifying a potentially equivalent subset of prior circuit models includes determining whether the hashed first signature matches a prior hashed signature of one of the subset of prior circuit models; and
wherein each prior circuit model is stored with a corresponding prior hashed signature in persistent memory.

20. A method of model checking a first circuit model comprising:
receiving a request from a user for a model check of the first circuit model including a set of test parameters of the model check;
responsive to receiving the user request, utilizing a processor to generate a first signature of the requested first circuit model and a subset of the test parameters;
utilizing the generated first signature to identify a potentially equivalent subset of prior circuit models from a database of signatures of previously tested prior circuit models stored in memory with corresponding prior test parameters and test results for each of the previously tested prior circuit models;
utilizing the processor to determine whether the requested first circuit model is functionally equivalent to one of the identified subset of prior circuit models;
in response to a positive determination of functional equivalence, providing the corresponding set of prior test results stored with the functionally equivalent prior circuit model to the user; and
in response to a negative determination of functional equivalence, utilizing the processor to perform a model check of the first circuit model and providing results of the model check to the user for use as model check results of the first circuit model.

21. The method of claim 20 further comprising:
determining whether the first circuit model is isomorphically equivalent to one of the subset of prior circuit models previously tested and stored in the database; and
in response to a positive determination of isomorphic equivalence, providing the corresponding set of prior test results stored with the isomorphically equivalent prior circuit model;
wherein the step of utilizing a processor to perform a model check of the first circuit model is performed in accordance with the set of test parameters in response to a negative determination of functional and isomorphic equivalence.

22. The method of claim 21 wherein the step of determining whether the first circuit model is isomorphically equivalent to one of the subset of prior circuit models is performed prior to the step of determining whether the first circuit model is functionally equivalent to one of the subset of prior circuit models.

23. The method of claim 21 wherein the circuit model is generated from a circuit design.

24. The method of claim 21 wherein each prior circuit model is stored with a corresponding prior signature in the database.

25. The method of claim 24 wherein the step of identifying the potentially equivalent subset of prior circuit models is performed prior to the steps of determining isomorphic equivalence and functional equivalence, and wherein in response to a negative determination of signature matching, performing the model check of the circuit model in accordance with the set of test parameters.

26. The method of claim 25 wherein each of the corresponding subset of prior test results include a set of prior test parameters, wherein the prior signature includes prior test parameters, and wherein the first signature includes a set of first test parameters for the first circuit model.

27. The method of claim 21 wherein the step of identifying the potentially equivalent subset of prior circuit models is performed prior to the steps of determining isomorphic equivalence and functional equivalence; wherein in response to a negative determination of identifying the potentially equivalent subset of prior circuit models, performing the model check of the circuit model;
wherein each of the corresponding set of prior test results include a set of prior test parameters;
wherein the prior signature includes prior test parameters;
wherein the first signature includes a set of first test parameters for the first circuit model;
wherein the step of determining whether the first circuit model is isomorphically equivalent to one of the subset of prior circuit models is performed prior to the step of determining whether the first circuit model is functionally equivalent to one of the subset of prior circuit models; and
wherein the circuit model is generated from a circuit design.

* * * * *